(12) United States Patent
Park

(10) Patent No.: US 10,095,574 B2
(45) Date of Patent: *Oct. 9, 2018

(54) APPARATUSES AND METHODS FOR COMPARING A CURRENT REPRESENTATIVE OF A NUMBER OF FAILING MEMORY CELLS

(71) Applicant: Micron Technology, Inc., Boise, ID (US)

(72) Inventor: Jae-Kwan Park, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/840,610

(22) Filed: Dec. 13, 2017

(65) Prior Publication Data
US 2018/0101427 A1   Apr. 12, 2018

Related U.S. Application Data

(60) Continuation of application No. 15/139,054, filed on Apr. 26, 2016, now Pat. No. 9,870,280, which is a continuation of application No. 14/494,808, filed on Sep. 24, 2014, now Pat. No. 9,349,420, which is a division of application No. 13/326,199, filed on Dec. 14, 2011, now Pat. No. 8,854,898.

(51) Int. Cl.
*G11C 7/00* (2006.01)
*G11C 29/00* (2006.01)
*G06F 11/07* (2006.01)
*G11C 7/06* (2006.01)
*G11C 7/10* (2006.01)
*G11C 29/24* (2006.01)

(52) U.S. Cl.
CPC ........ *G06F 11/079* (2013.01); *G06F 11/0727* (2013.01); *G06F 11/0751* (2013.01); *G11C 7/062* (2013.01); *G11C 7/065* (2013.01); *G11C 7/1057* (2013.01); *G11C 7/1063* (2013.01); *G11C 29/24* (2013.01); *G11C 2207/063* (2013.01)

(58) Field of Classification Search
CPC .............. G06F 11/079; G06F 11/0727; G06F 11/0751; G11C 7/062; G11C 7/065; G11C 7/1057; G11C 7/1063; G11C 29/24; G11C 2207/063
See application file for complete search history.

(56) References Cited

U.S. PATENT DOCUMENTS

| | | | |
|---|---|---|---|
| 7,024,598 B2 | 4/2006 | Jeong et al. | |
| 7,317,636 B2 | 1/2008 | Ide et al. | |
| 7,355,892 B2 | 4/2008 | Hemink | |

(Continued)

*Primary Examiner* — Toan Le
(74) *Attorney, Agent, or Firm* — Dorsey & Whitney LLP

(57) ABSTRACT

Apparatuses and methods for comparing a sense current representative of a number of failing memory cells of a group of memory cells and a reference current representative of a reference number of failing memory cells is provided. One such apparatus includes a comparator configured to receive the sense current and to receive the reference current. The comparator includes a sense current buffer configured to buffer the sense current and the comparator is further configured to provide an output signal having a logic level indicative of a result of the comparison.

20 Claims, 5 Drawing Sheets

(56) References Cited

U.S. PATENT DOCUMENTS

| | | |
|---|---|---|
| 7,495,968 B2 | 2/2009 | Lee et al. |
| 7,539,922 B2 | 5/2009 | Kim |
| 7,545,692 B2 | 6/2009 | Jang |
| 8,189,386 B2 | 5/2012 | Park |
| 8,270,215 B2 | 9/2012 | You et al. |
| 8,625,355 B2 | 1/2014 | Chokan et al. |
| 8,854,898 B2 | 10/2014 | Park |
| 9,349,420 B2 | 5/2016 | Park |
| 9,870,280 B2 * | 1/2018 | Park ..................... G06F 11/079 |
| 2007/0103973 A1 * | 5/2007 | Confalonieri ....... G11C 11/5642 365/185.2 |
| 2008/0013390 A1 | 1/2008 | Zipprich-Rasch |
| 2010/0195411 A1 | 8/2010 | Abiko |
| 2011/0051514 A1 | 3/2011 | Han et al. |
| 2011/0194346 A1 | 8/2011 | Yoon |
| 2011/0199812 A1 * | 8/2011 | Kitagawa ............. G11C 7/1048 365/148 |
| 2011/0249507 A1 * | 10/2011 | Sarin ................... G11C 11/5642 365/185.19 |
| 2013/0155780 A1 | 6/2013 | Park |
| 2015/0009766 A1 | 1/2015 | Park |
| 2016/0239367 A1 | 8/2016 | Park |

* cited by examiner

APPARATUSES AND METHODS FOR COMPARING A CURRENT REPRESENTATIVE OF A NUMBER OF FAILING MEMORY CELLS

CROSS REFERENCE TO RELATED APPLICATIONS

This application is a continuation of U.S. patent application Ser. No. 15/139,054, filed Apr. 26, 2016, issued as U.S. Pat. No. 9,870,280 on Jan. 16, 2018, which is a continuation of U.S. patent application Ser. No. 14/494,808, tiled Sep. 24, 2014 and issued as U.S. Pat. No. 9,349,420 on May 24, 2016, which is a divisional of U.S. patent application Ser. No. 13/326,199, filed Dec. 14, 2011 and issued as U.S. Pat. No. 8,854,898 on Oct. 7, 2014. The aforementioned applications and patents are incorporated herein by reference, in their entirety for any purpose.

TECHNICAL FIELD

Embodiments of the invention relate generally to semiconductor memory, and more specifically, in one or more of the illustrated embodiments, to comparing a current that represents a number of failing memory cells to a reference current that represents a reference number of failing memory cells.

BACKGROUND OF THE INVENTION

Semiconductor memories include memory cells that store data. The data is stored by writing the data to the memory cells. The data may be retrieved by reading the memory cells. The stored data should be accurately written to the memory cells, otherwise, the data will not be accurate when read. In some memories, data is written by repeating a programming cycle until the correct data is in fact stored by the memory cells. In determining the necessary number of programming cycles, the data currently stored by the memory cells being written may be read and compared to the expected write data in order to determine if additional programming cycles need to be performed. No further programming cycles are necessary when it is determined that an acceptable number of memory cells have accurately stored the expected write data.

In some memories, the number of memory cells that may require additional programming may be determined by using a comparator to compare a current that represents a number of memory cells that do not yet accurately store the expected write data (which are referred to hereinafter as "failing memory cells") to a reference current. The reference current represents a reference number of memory cells. Each of the failing memory cells contributes an incremental current to the total current. The total current is compared to the reference current. By comparing the two currents, the number of failing memory cells can be determined relative to the reference number of memory cells. Based on the comparison of the currents, for example, whether the current representing the number of failing memory cells is greater than the reference current, it can de determined whether the number of failing memory cells is greater than the reference number of memory cells.

The current comparison is repeated after a programming cycle to gauge whether additional programming cycles are necessary. The comparison takes time, however, because it takes time to develop and compare the current representing the number of failing memory cells to the reference current. A contributing factor to this time is the electrical load presented to the comparator. A higher electrical load typically results in longer times to complete the comparison. As the number of memory cells being evaluated during a comparison increases, such as with higher density memories, the electrical load presented during comparison also increases. As a result, the time for the comparison to complete increases, thereby slowing down the overall operation.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
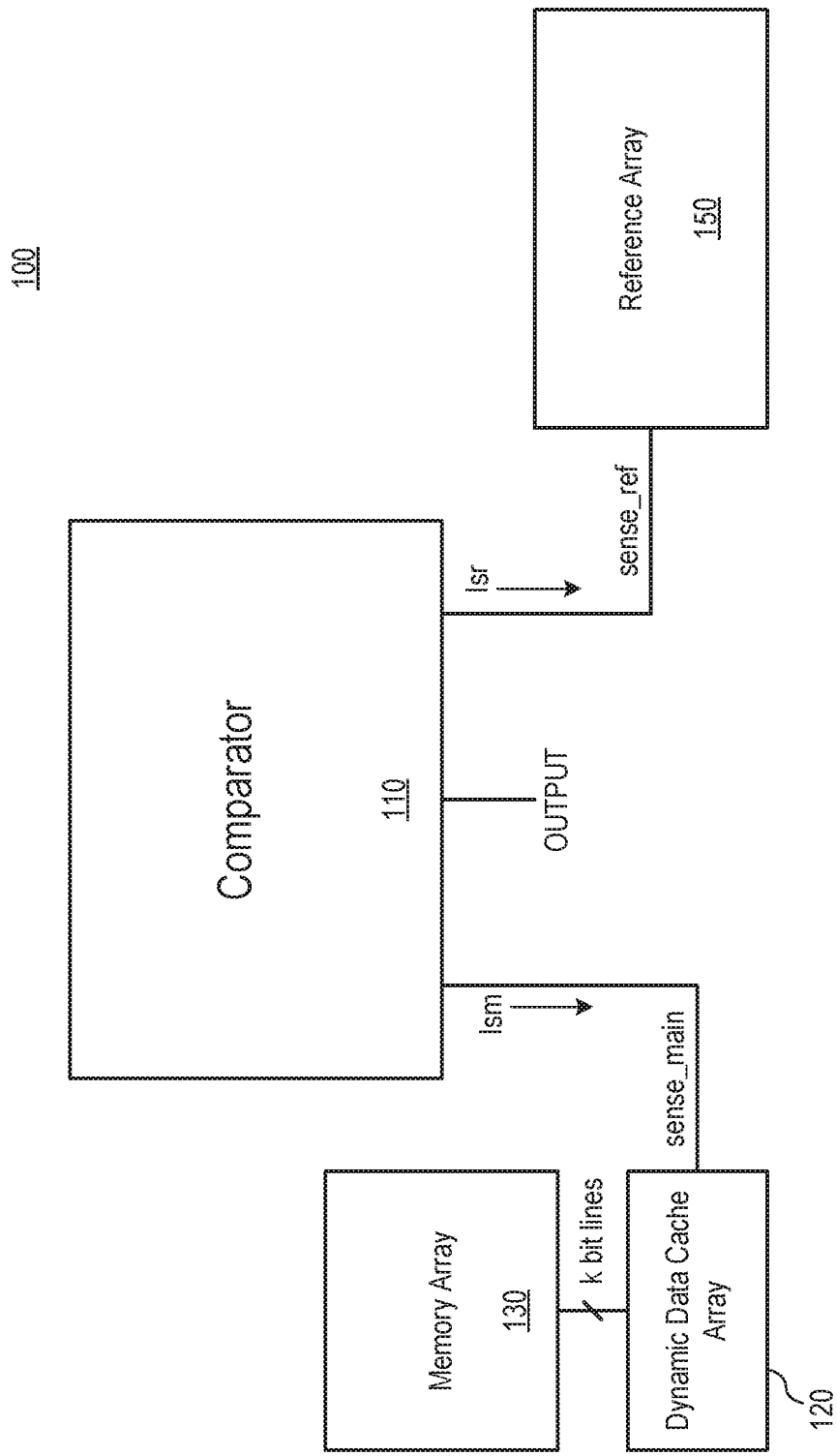
FIG. 1 is a block diagram of an apparatus according to an embodiment of the invention.

FIG. 1 illustrates an apparatus in the form of a circuit 100 according to an embodiment of the invention for assessing a number of failing memory cells for a group of memory cells. The circuit 100 includes a comparator 110 coupled to a dynamic data cache (DDC) array 120. The DDC array 120 is configured to sense and cache data of a group of memory cells of memory array 130. The DDC array 120 is further configured to provide a memory sense current Ism at a sense-main node. The Ism current is representative of a number of failing memory cells for the group of memory cells cached by the DDC array 120. The comparator 110 is further coupled to a reference array 150 that is configured to provide a reference current Isr at a sense-ref node that is representative of a reference number of failing memory cells to which the Ism current is compared by the comparator 110. The reference number of failing memory cells represented by the Isr current may be selectable. The comparator 110 is configured to compare the Ism current to the Isr current and provide an output signal OUTPUT based at least in part on the comparison. In some embodiments, the comparator 110 may provide an OUTPUT signal indicative of the magnitude of the Ism current relative to the Isr current. For example, the OUTPUT signal may be indicative of whether the Ism current is greater than the Ism current. The comparator 110 includes a buffer circuit (not shown) coupled to the sense_main node. The buffer circuit may reduce parasitic load capacitances and/or resistances between the sense-main node and the comparator sense node. As a result, the speed of sensing the number of failing memory cells of the group may be improved.

In operation, the DDC array 120 senses and caches data of a group of memory cells and provides a Ism current representative of a number of failing memory cells of the group. The reference array 150 provides an Isr current representative of N failing memory cells. Because the Ism current represents a number of failing memory cells of the group and the Isr current represents a reference number of failing memory cells, the OUTPUT signal may represent the number of failing memory cells relative to a reference number of failing memory cells. For example, an Isr current provided by the reference array 120 may represent N failing memory cells. The comparator 110 compares the Ism current to the resulting Isr current and provides an OUTPUT signal having a logic level (e.g., high logic level) indicative of whether the number of failing memory cells of the group (represented by Ism) is greater than N memory cells.

The number of N failing memory cells represented by the Isr current provided by the reference array 120 may be changed so that the number of failing memory cells of the group represented by the Ism current may be determined. That is, as the N number of failing memory cells is changed and the comparison is performed by the comparator 110, the OUTPUT signal may change from indicating that the number of failing memory cells of the group is greater than N to indicating that the number of failing memory cells of the group is not greater than N. Thus, the N number at which the OUTPUT signal changes indicates the number of failing memory cells of the group.

In some embodiments, the OUTPUT signal may have a logic level indicative of whether the number of failing memory cells of the group (represented by Ism) is less than N memory cells. The N number may be increased and the resulting Isr compared to the Ism by the comparator 110. The N number at which the OUTPUT signal changes logic levels indicating a change from the number of failing memory cells of the group being less than N to not less than N may indicate the number of failing memory cells of the group.

Additionally, in some embodiments the N number may be changed by one memory cell, changing the Isr current by a resolution of one memory cell. As a result, the number of failing memory cells of the group may be determined to within one memory cell. In some embodiments, the N number may be changed by greater than one memory cell, changing the Isr current by a resolution of greater than one memory cell. As a result, the number of failing memory cells of the group may be determined to within a range of greater than one memory cell. For example, the N number may be changed by five memory cells, resulting in a determination of the number of failing memory cells of the group within a range of five memory cells.

Figure 2:
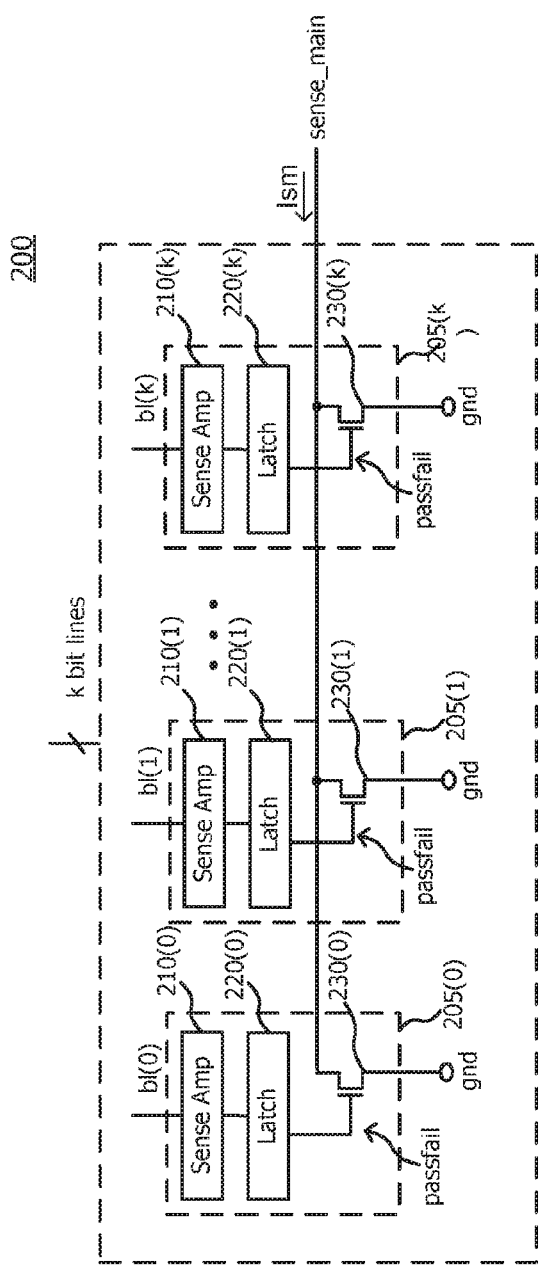
FIG. 2 is a block diagram of an example dynamic data cache array for use in an apparatus according to an embodiment of the invention.

FIG. 2 illustrates a dynamic data cache (DDC) array 200. The DDC array 200 may be used for the DDC array 120 of the embodiment of FIG. 1. The DDC array 200 includes DDC units 205(0)-205(k). The DDC units 205 are configured to sense data from a respective data line, such as bit line bl, and provide a respective current responsive to the sensed data being different than expected data. The respective current contributes to the Ism current that is provided for comparison (e.g., to comparator 110). Each DDC unit 205 can include a sense amplifier 210 and latch 220. The sense amplifier 210 is configured to sense data from a memory cell coupled to the respective bl line, and the latch 220 provides a passfail signal having a logic level indicative of whether the data sensed by the sense amplifier 210 matches expected data latched by the latch 220. The latched expected data may be, for example, write data to be written to the respective memory cell during a memory program operation. The passfail signal is provided to a cell 230 coupled to the sense_main node and a reference voltage node, for example, a ground node. The cell 230 is configured to be activated responsive to an active passfail signal. An activated cell 230 is conductive and provides a current path between the sense_main node and the reference voltage node. Each conductive cell 230 incrementally increases the Ism current because each additional current path provides another current path between the sense_node and the reference voltage node, thus contributing to the Ism current. The cells 230(0)-230(k) may be configured to conduct substantially the same current when activated. As a result, each activated cell 230 provides substantially the same incremental increase in the Ism current.

In operation, data for a group of memory cells (e.g., a row of memory cells) of a memory array (e.g., memory array 130) is sensed by the DDC 200, each memory cell of the group coupled to a respective data line that is coupled to a respective DDC unit 205. Each of the sense amplifiers 210(0)-210(k) sense the data for a respective memory cell and the respective latch 220(0)-220(k) provides a respective passfail signal having a logic level indicative of whether the sensed data matches the latched expected data. Based on the logic level of the passfail signal, the respective cell 230 may be conductive to couple the sense_main node to the reference voltage node. For example, as shown in the embodiment of FIG. 2, the cell 230 is conductive responsive to a high logic level passfail signal. Assuming a high logic level passfail signal is provided by the latch 220 when the sensed data does not match the latched expected data, the cell 230 is made conductive responsive to the sense data not matching the expected data latched in the latch 220.

Figure 3:
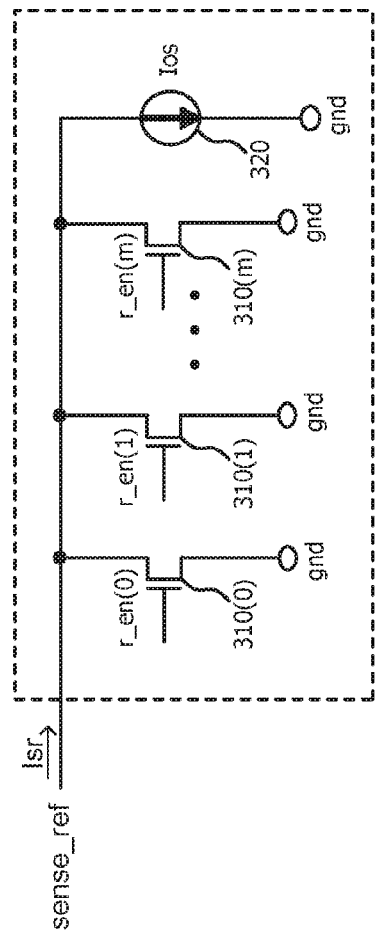
FIG. 3 is a block diagram of an example reference array for use in an apparatus according to an embodiment of the invention.

FIG. 3 illustrates a reference array 300. The reference array 300 may be used for the reference array 150 of the embodiment of FIG. 1. The reference array 300 includes reference cells 310(0)-310(m) coupled to the sense_ref node and a reference voltage node, for example, a ground node. The reference cells 310(0)-310(m) are provided a respective activation signal r_en(0)-r_en(m). Responsive to an active r_en signal, the respective reference cell 310 is activated and provides a current path from the sense_ref to the reference node. The reference array 300 further includes a current source 320 coupled to the sense_ref node. The current source 320 is configured to provide a current Ios to the sense_ref node. The Ios current may be approximately a fraction of the current conducted by an active reference cell. As will be described in more detail below, the Ios current provided by the current source 320 contributes to the Isr current, which is the sum of the currents conducted by the active reference cells and the fractional current.

In operation, a number N of reference cells 310 may be activated by the respective r_en signal. In some embodiments, each of the reference cells 310 may conduct the same current when activated. Thus, the current contribution to the Isr current by the enabled reference cells 310 is N times the enabled reference cell current. Each additional enabled reference cell will incrementally increase the Isr current. Additionally, the current conducted by an active reference cell may be substantially the same as the current added by each failing memory cell of the group to the Ism current provided by a DDC array, for example, DDC array 120. In this manner, the N number of enabled reference cells may set a reference number of failing memory cells (represented by the Isr current) to which the failing memory cells of the group are compared (represented by the Ism current), such as to determine the number of failing memory cells of the group.

The Ios current provided by the current source 320 can be used to prevent the Isr current from being equal to the Ios current. That is, in the event the number of failing memory cells of the group (represented by the Ism current) is the same number as the reference number of failing memory cells (represented by the Isr current), the Ios current will provide an offset so that the Ism current will either be less than the Isr current or not less than the Isr current, but not approximately equal to the Isr current. The Ios current, as previously described, may be a fraction of the current contributed by an active reference cell.

The Ios current may provide a positive contribution to the Isr current, or in some embodiments, provide a negative contribution to the Isr current. Where the Ios current provides a positive contribution, for example, a comparator comparing Isr and Ism currents may provide an active OUTPUT when the number of failing memory cells of the group is greater than the reference number of failing memory cells. Conversely, where the Ios current provides a negative contribution to the Isr current, the comparator may provide an active OUTPUT signal when the number of failing memory cells of the group is equal to or greater than the reference number of failing memory cells.

Figure 4:
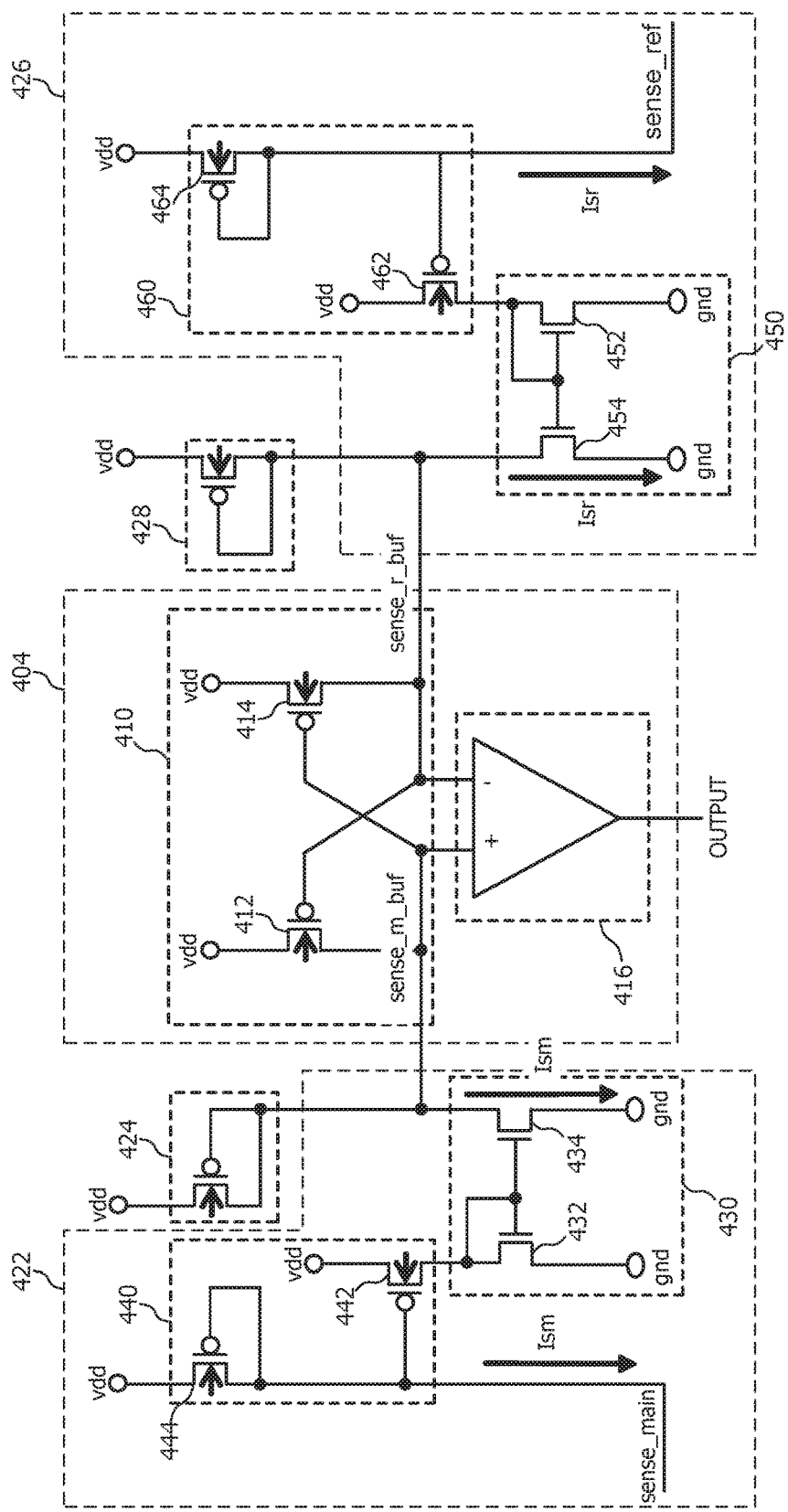
FIG. 4 is a schematic diagram of a comparator according to an embodiment of the invention.

FIG. 4 illustrates a comparator 400 according to an embodiment of the invention. The comparator 400 is configured to compare an Ism current provided to a sense_main node to a Isr current provided to a sense_ref node and provide an output signal OUTPUT based at least in part on the comparison, for example, an active OUTPUT signal responsive to the Ism current being less than the Isr current. As previously discussed, the Ism current may be provided by a DDC array and represent a number of failing memory cells of a group, and the Isr current may be provided by a reference array and represent a reference number of failing memory cells. As a result, Ism less than Isr may indicate that the number of failing memory cells of a group is less than the reference number of failing memory cells.

The comparator 400 includes an amplifier 404 that includes an amplifier stage 410 and an output stage 416. The amplifier stage 410 is configured to amplify a difference between the sense nodes sense_m_buf and sense_r_buf, and the output stage 416 provides the OUTPUT signal based on the amplified difference. The output stage 416 may be a operational amplifier configured to amplify a voltage difference between the sense_m_buf and sense_r_buf nodes. Other circuits may be used for the output stage 416 as well, however.

A buffer circuit 422 is coupled to the sense_m_buf node of the amplifier 404 and the sense_main node of the comparator 400, and a buffer circuit 426 is coupled to the sense_r_buf node of the amplifier 404 and the sense_ref node of the comparator 400. The buffer circuit 422 includes a current mirror 430 coupled to a sense_m_buf and a current mirror 440 coupled to the current mirror 430 to mirror an Ism current provided a sense_main node of the comparator 400 to the sense_m_buf node. Load circuit 424 is coupled to the sense_m_buf node. The buffer circuit 426 includes a current mirror 450 coupled to the sense_r_buf node and a current mirror 460 coupled to the current mirror 450 to mirror an Isr current provided to a sense_ref node of the comparator 400. Load circuit 428 is coupled to the sense_r_buf node. The current mirrors 440, 460 are coupled to the supply voltage node, and current mirrors 430, 450 are coupled to a reference voltage node providing a reference voltage, for example, ground.

The buffer circuit 422 coupled to the sense_r_main node of the comparator 400 may buffer the sense_m_buf node from electrical loading of the sense_main node, for example, parasitic load capacitances and/or resistances, which may result from being coupled to a dynamic data cache array (e.g., DDC array 120). Likewise, the buffer circuit 426 may buffer the sense_r_buf node from electrical loading of the sense_ref node. Sense speed of the comparator 400 may be improved by buffering the sense_m_buf and sense_r_buf nodes of the amplifier stage 410 because the transistors 412, 414 need to pull either the sense_m_buf or sense_r_buf nodes to the supply voltage, which have relatively light electrical loads of the current mirrors 430, 450.

The amplifier stage 410 is illustrated in the embodiment of FIG. 4 as a pair of cross-coupled p-channel field effect transistors (pFETs) coupled to a supply voltage node that provides a supply voltage, for example, vdd. The current mirrors 440, 460 are shown in the embodiment of FIG. 4 as including gate coupled pFETs 442, 444 and 462, 464, and the current mirrors 430, 450 are shown as including gate coupled n-channel field effect transistors (nFETs) 432, 434 and 452, 454, all respectively. The load circuits 424, 428 are illustrated as diode coupled pFETs coupled to the supply voltage node. The amplifier stage 410, current mirrors 430, 440 450, 460, and the load circuits 424, 428 may be configured differently than that shown in FIG. 4, and the invention is not limited to the particular embodiment illustrated by FIG. 4.

In operation, the Ism current provided at the sense_ main node is mirrored by the current mirrors 430, 440 of the buffer circuit 422 to the sense_m_buf node of the amplifier stage 410. The load circuit 424 provides a voltage at the sense_ m_buf node based at least in part on the Ism current mirrored by the current mirrors 430, 440. Thus, the resulting voltage at the sense_m_buf node is representative of the Ism current, which as previously discussed, may represent a number of failed memory cells of a group. Similarly, the Isr current provided at the sense_ref node of the comparator 400 is mirrored by the current mirrors 450, 460 of the buffer circuit 426 to the sense_r_buf node of the amplifier stage 410. The load circuit 428 provides a voltage at the sense_r_buf node based at least in part on the Isr current, which may be representative of the Isr current.

The amplifier stage 410 amplifies the voltage difference between the sense_m_buf and sense_r_buf nodes, in response to which the output stage 416 provides an OUTPUT signal having a logic level that is indicative of the result of the comparison. For example, where the voltage of the sense_m_buf node is greater than the voltage of the sense_r_buf node (i.e., the Ism current is less than the Isr current), the sense_m_buf node is coupled to the supply voltage node through the transistor 412. As a result, the output stage 416 provides an OUTPUT signal having a high logic level, which may be interpreted as the number of failing memory cells of a group (represented by Ism) is equal to or less than the reference number of failing memory cells (represented by Isr, assuming an offset current Ios that provides a positive contribution to the Isr). An OUTPUT signal having a low logic level is provided by the output stage 416 when the voltage of the sense_m_buf node is less than the voltage of the sense_r_buf node (i.e., the Ism current is greater than the Isr current). The low logic level OUTPUT signal may be interpreted as the number of failing memory cells of a group is greater than the reference number of failing memory cells.

Figure 5:
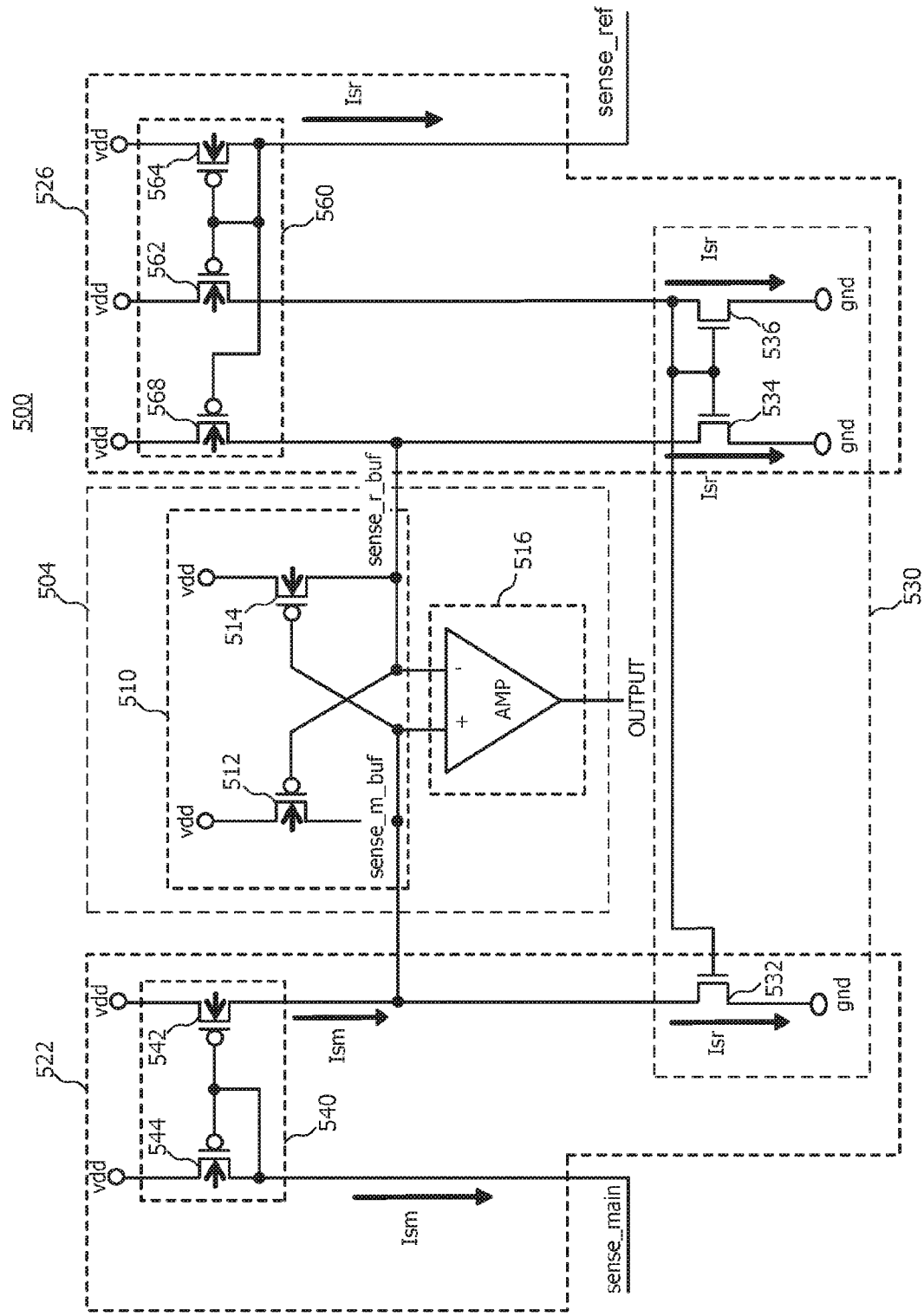
FIG. 5 is a schematic diagram of a comparator according to an embodiment of the invention.

FIG. 5 illustrates a comparator 500 according to an embodiment of the invention. The comparator 500 is configured to compare an Ism current provided to a sense_main node to a Isr current provided to a sense_ref node and provide an output signal OUTPUT based at least in part on the comparison. The comparator 500 includes an amplifier 504 that includes an amplifier stage 510 and an output stage 516. The amplifier stage 510 is configured to amplify a difference between the sense nodes sense_m_buf and sense_r_buf, and the output stage 516 provides the OUTPUT signal based on the amplified difference. The output stage 516 is illustrated in FIG. 5 as an operational amplifier; other circuits may be used for the output stage 516 as well, however.

A buffer circuit 522 is coupled to the sense_m_buf node of the amplifier 504 and the sense_ main node of the comparator 500, and a buffer circuit 526 is coupled to the sense_r_buf node of the amplifier 504 and the sense_ref node of the comparator 500. The buffer circuit 522 includes a current mirror 540 coupled to a sense_m_buf node to mirror an Ism current provided a sense_main node of the comparator 400 to the sense_m_buf node. The buffer circuit 526 includes a current mirror 560 coupled to the sense_r_buf node to mirror an Isr current provided to a sense_ref node of the comparator 500. The current mirrors 540, 560 are coupled to the supply voltage node that provides a supply voltage, for example, Vdd. A current mirror 530 is coupled to the current mirror 540 and further coupled to current mirror 560 to mirror the Isr current to the sense_m_buf and sense_r_buf nodes. The current mirror 530 is coupled to a reference voltage node providing a reference voltage, for example, ground.

The amplifier stage 510 is illustrated in the embodiment of FIG. 5 as a pair of cross-coupled pFETs coupled to the supply voltage node. The current mirrors 540, 560 are shown in the embodiment of FIG. 5 as including gate coupled pFETs 542, 544 and 562, 564, 568, and the current mirror 530 is shown as including gate coupled nFETs 532, 534, 536. The amplifier stage 510, and current mirrors 530, 540 560 may be configured differently than that shown in FIG. 5, however, and the invention is not limited to the particular embodiment illustrated by FIG. 5.

In operation, the Ism current provided at the sense_main node is mirrored by the current mirror 540 of the buffer circuit 522 to the sense_m_buf node of the amplifier stage 510. The Isr current provided at the sense_ref node of the comparator 500 is mirrored by the current mirrors 560 of the buffer circuit 526 to the sense_r_buf node of the amplifier stage 510. The Isr current is further mirrored to the sense_m_buf node. As previously discussed, the Ism current may be representative of the number of failing memory cells of a group and the Isr current may be representative of a reference number of failing memory cells to which the number of failing memory cells of the group (as represented by the Ism current) are compared.

A voltage is established at the sense_m_buf node based at least in part on the Ism current provided by the current mirror 540 and the Isr current provided by the current mirror 530. Likewise a voltage is established at the sense_rbuf node based at least in part on the Isr current provided by the current mirrors 530 and 560. As a result of a current difference between the Ism and Isr currents provided to the sense_m_buf node, the voltage established at the sense_ m_buf node will be different than the voltage established at the sense_r_buf node. For example, where the Ism current is less than the Isr current the voltage established at the sense_m_buf node is less than the voltage established at the sense_r_buf node. Conversely, where the Ism current is not less than the Isr current the voltage established at the sense_m_buf node is not less than the voltage established at the sense_r_buf node.

The amplifier stage 510 amplifies the voltage difference between the sense_m_buf and sense_r_buf nodes, in response to which the output stage 516 provides an OUTPUT signal having a logic level that is indicative of the voltage difference. For example, where the voltage of the sense_m_buf node is not less than the voltage of the sense_r_buf node (i.e., the Ism current is not less than the Isr current), the sense_m_buf node is coupled to the supply voltage node through the transistor 512. As a result, the output stage 416 provides an OUTPUT signal having a high logic level, which may be interpreted as the number of failing memory cells of a group (represented by Ism) is greater than the reference number of failing memory cells (represented by Isr, assuming an offset current Ios that provides a positive contribution to the Isr). An OUTPUT signal having a low logic level is provided by the output stage 416 when the voltage of the sense_m_buf node is less than the voltage of the sense_r_buf node (i.e., the Ism current is less than the Isr current). The low logic level OUTPUT signal may be interpreted as the number of failing memory cells of a group (represented by Ism) is equal to or less than the reference number of failing memory cells (represented by Isr).

The comparators 400, 500, and more generally comparators according to embodiments of the invention may provide the benefit of reducing an overall sense time for repetitive comparisons of the Ism and Isr currents. For example, to determine a pass and fail point for the number of failing memory cells of the group, the reference number of failing memory cells represented by the Isr current may be changed and then compared again to the Ism current. The cycle of changing the reference number of failing memory cells and comparing the ism current to the new Isr current may continue until the OUTPUT signal changes from indicating a pass condition to indicating a fail condition, or vice versa. The reference number of failing memory cells at which the OUTPUT signal changes may be used to determine the number of failing memory cells of the group, or a range including the number of failing memory cells of the group. In such applications of repetitive comparisons of the Ism and Isr currents, having buffers to reduce the electrical loads on the sense_m_buf and sense_r_buf nodes allows for performing comparisons between the changing Isr current and the Ism current relatively quickly. As a result, the overall sense time to determine a transition point for the OUTPUT signal may be decreased.

In some embodiments, a comparator includes a buffer circuit coupled to the sense_m_buf node, but not the sense_r_buf node. In this manner the sense_m_buf node may be buffered from electrical loading of a DDC array and provide the benefits of including a buffer circuit previously discussed. The unbuffered sense_r_buf node, however, may not be subjected to as much electrical loading as an unbuffered sense_r_buf node, and while the overall sense time resulting from using a single buffer may be longer than in embodiments using two buffers, the overall sense time may still be shorter in comparison to a comparator that does not include any buffer circuits. Single buffer circuit embodiments, however, may have an advantage over dual buffer comparator circuits because of reduced circuit size.

Figure 6:
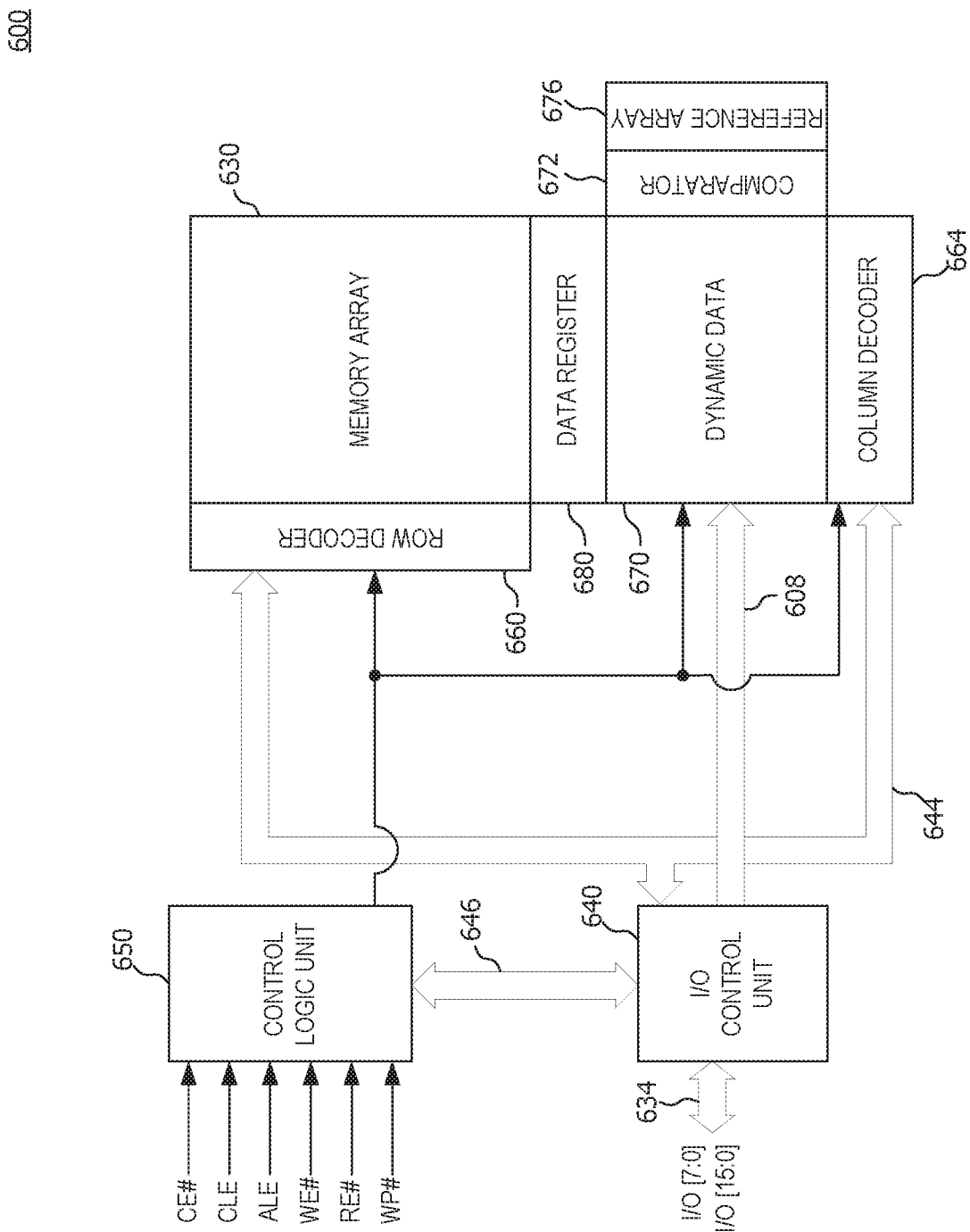
FIG. 6 is a block diagram of a memory according to an embodiment of the invention.

FIG. 6 illustrates portions of a memory 600 including a comparator according to an embodiment of the present invention. The memory 600 includes an array 630 of memory cells. The memory cells may be NAND flash memory cells, but may also be NOR flash, DRAM, SDRAM, or any other type of memory cells. Command signals, address signals and write data signals may be provided to the memory 600 as sets of sequential input/output ("I/O") signals transmitted through an I/O bus 634. Similarly, read data signals may be provided from the flash memory 600 through the I/O bus 634. The I/O bus is connected to an I/O control unit 640 that routes the signals between the I/O bus 634 and an internal data bus 608, an internal address bus 644, and an internal command bus 646. The memory 600 also includes a control logic unit 650 that receives a number of control signals either externally or through the command bus 646 to control the operation of the memory 600.

The address bus 644 applies block-row address signals to a row decoder 660 and column address signals to a column decoder 664. The row decoder 660 and column decoder 664 may be used to select blocks of memory or memory cells for memory operations, for example, read, program, and erase operations. The column decoder 664 enables write data signals to be applied to columns of memory corresponding to the column address signals and allow read data signals to be coupled from columns corresponding to the column address signals.

After the row address signals have been applied to the address bus 644, the I/O control unit 640 routes write data signals to a dynamic data cache 670. The write data signals are stored in the dynamic data cache 670 in successive sets each having a size corresponding to the width of the I/O bus 634. The dynamic data cache 670 sequentially stores the sets of write data signals for an entire page (e.g., a row or part of a row) of memory cells in the array 630. All of the stored write data signals are then used to program the page of memory cells in the array 630 selected by the block-row address coupled through the address bus 644. In a similar manner, during a read operation, data signals from a page of memory cells selected by the block-row address coupled through the address bus 644 are stored in a data register 680. Sets of data signals corresponding in size to the width of the I/O bus 634 are then sequentially transferred through the I/O control unit 640 from the data register 680 to the I/O bus 634.

The dynamic data cache 670 may further provide a memory sense current Ism (not shown) that is representative of a number of failing memory cells for a group of memory cells, for example, a page of memory cells. A comparator 672 coupled to the dynamic data cache 670 compares the Ism current to a reference current Isr provided by reference cell array 676. As previously discussed, the Isr current may be representative of a reference number of failing memory cells. In this manner, the comparator 672 may provide an output signal indicative of the number of failing memory cells for the group of memory cells (represented by the Ism current) relative to the reference number of failing memory cells (represented by the Isr current).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
receiving a sense current representative of a number of failing memory cells of a group of memory cells, including buffering the sense current to generate a buffered sense current;
receiving a reference current representative of a reference number of failing memory cells;
amplifying a difference between the buffered sense current and the reference current; and
generating an output signal indicative of a magnitude of the buffered sense current relative the reference current.

2. The method of claim 1, further comprising providing a sense voltage based, at least in part, on the magnitude of the buffered sense current.

3. The method of claim 1, wherein buffering the sense current includes providing the buffered sense current to a sense node of an amplifier.

4. The method of claim 3, wherein receiving the reference current includes providing the reference current to a reference node of the amplifier.

5. The method of claim 4, wherein receiving the sense current includes receiving the sense current at a first current mirror and mirroring the sense current to a second current mirror.

6. The method of claim 5, wherein mirroring the sense current to the second current mirror includes mirroring the sense current from the first current mirror to the sense node of the amplifier.

7. The method of claim 1, further comprising buffering the reference current before amplifying the difference between the buffered sense current and the reference current.

8. The method of claim 7, wherein buffering the reference current comprises providing the reference current to a comparator having a reference current buffer configured to provide a buffered reference current.

9. The method of claim 1, wherein buffering the sense current to generate the buffered sense current comprises determining a difference between the sense current and the reference current, the sense current having a magnitude that is a sum of currents provided by each of the number of failing memory cells of the group of memory cells.

10. The method of claim 1, further comprising altering the reference current to represent another reference number of failing memory cells and repeating amplifying the difference between the buffered sense current and the reference current.

11. An apparatus comprising:
a sense node buffer configured to receive a sense current representative of a number of failing memory cells of a group of memory cells and buffer the sense current to generate a buffered sense current; and
an amplifier having a sense node and a reference node, the sense node coupled to the sense node buffer to receive the buffered sense current, the reference node configured to receive a reference current representative of a reference number of failing memory cells, the amplifier configured to amplify a difference between the buffered sense current and the reference current and provide an output signal indicative of a magnitude of the buffered sense current relative the reference current.

12. The apparatus of claim 11, further comprising a load circuit coupled to the sense node, the load circuit configured to provide a sense voltage based, at least in part, on the magnitude of the buffered sense current.

13. The apparatus of claim 12, wherein the load circuit comprises diode coupled p-type field effect transistors (pFETs) coupled to a supply voltage node.

14. The apparatus of claim 11, wherein the sense node buffer comprises a first current mirror configured to receive the sense current and mirror the sense current to a second current mirror.

15. The apparatus of claim 14, wherein the second current mirror is configured to mirror the sense current to the sense node of the amplifier.

16. The apparatus of claim 14, wherein the first current mirror comprises a p-channel field effect current mirror and the second current mirror comprises an n-channel field effect current mirror.

17. The apparatus of claim 11, further comprising a dynamic data cache to provide the sense current to the sense node buffer.

18. The apparatus of claim 17, wherein the dynamic data cache is configured to sense and cache data of the group of memory cells.

19. The apparatus of claim 17, further comprising an input/output control unit to route write data signals to the dynamic data cache, the dynamic data cache configured to store the write data signals.

20. The apparatus of claim 19, wherein the dynamic data cache is configured to program the group of memory cells based on the stored write data signals.

* * * * *